United States Patent
Vanderstraeten

(10) Patent No.: US 6,468,402 B1
(45) Date of Patent: Oct. 22, 2002

(54) PROCESS FOR COATING A SUBSTRATE WITH TITANIUM DIOXIDE

(75) Inventor: Johan Emile Marie Vanderstraeten, Drongen (BE)

(73) Assignee: Bekaert VDS, Deinze (BE)

(*) Notice: Subject to any disclaimer, the term of this patent is extended or adjusted under 35 U.S.C. 154(b) by 0 days.

(21) Appl. No.: 09/589,098

(22) Filed: Jun. 8, 2000

Related U.S. Application Data

(63) Continuation of application No. 09/101,690, filed as application No. PCT/EP97/00021 on Jan. 3, 1997, now abandoned.

(30) Foreign Application Priority Data

Jan. 5, 1996 (GB) ............................................. 9600210

(51) Int. Cl.⁷ .......................... C23C 14/08; C23C 14/34; C23C 14/35

(52) U.S. Cl. ............................ 204/192.15; 204/192.12; 204/192.27; 204/192.22

(58) Field of Search ................................. 428/432, 702; 204/192, 1, 192.11, 192.12, 192.15, 192.26, 298.02, 298.12, 298.23, 298.28, 192.27, 192.22; 427/453, 446

(56) References Cited

U.S. PATENT DOCUMENTS

| | | |
|---|---|---|
| 232,680 A | 9/1880 | Cammann |
| 1,231,280 A | 6/1917 | Melton |
| 1,438,462 A | 12/1922 | Palmgren |
| 1,595,061 A | 8/1926 | Scott |
| 4,029,566 A | 6/1977 | Brandmair et al. |
| 4,216,259 A | 8/1980 | Groth |
| 4,252,629 A | 2/1981 | Bewer et al. |
| 4,336,119 A | 6/1982 | Gillery |
| 4,422,916 A * | 12/1983 | McKelvey |
| 4,422,917 A | 12/1983 | Hayfield |
| 4,450,201 A * | 5/1984 | Brill et al. ................... 428/336 |
| 4,861,680 A | 8/1989 | Meyer et al. |
| 4,931,213 A | 6/1990 | Cass |
| 5,105,310 A | 4/1992 | Dickey |
| 5,126,218 A | 6/1992 | Clarke |
| 5,196,400 A | 3/1993 | Chen et al. |
| 5,354,446 A | 10/1994 | Kida et al. |
| 5,589,280 A | 12/1996 | Gibbons et al. |
| 5,593,784 A | 1/1997 | Chinzi |
| 5,593,786 A | 1/1997 | Parker et al. |
| 5,605,609 A | 2/1997 | Ando et al. |
| 5,609,924 A | 3/1997 | McCurdy et al. |
| 5,611,899 A | 3/1997 | Maass |
| 5,616,225 A | 4/1997 | Sieck et al. |
| 5,618,388 A | 4/1997 | Seeser et al. |
| 5,620,572 A | 4/1997 | Bjornard et al. |
| 5,869,808 A | 2/1999 | Hyllberg |
| 6,193,856 B1 | 2/2001 | Kida et al. |
| 6,334,938 B2 | 2/2001 | Kida et al. |
| 2001/0020586 A1 | 9/2001 | Kida et al. |

FOREIGN PATENT DOCUMENTS

| | | |
|---|---|---|
| GB | 2 028 376 A | 3/1980 |
| JO | 9-189801 A | 9/1997 |
| JP | 62-161945 | 9/1987 |
| JP | 63178474 A2 | 7/1988 |
| JP | 1-118807 | 1/1989 |
| JP | 7215074 | 7/1995 |
| JP | 7-233469 | 7/1995 |
| JP | 7-233469 | 9/1995 |
| JP | 8-134638 | 5/1996 |
| JP | 9-189801 | 7/1997 |
| WO | 0 799 255 B1 | 12/1995 |
| WO | 0 753 882 A1 | 4/1996 |
| WO | WO 97/03763 | 2/1997 |
| WO | WO 97/07066 | 2/1997 |
| WO | WO 97/08359 | 3/1997 |
| WO | WO 97/25201 | 7/1997 |

OTHER PUBLICATIONS

Abstract of Japanese Published Patent Application No. JP1118807, *Patent Abstracts of Japan*, Publication Date: Nov. 5, 1989.

JP Application Laid–Open No. Sho 62–161946/1987 Application No. Sho 60–18073/1985, Aug. 20, 1985, Toyo Soda kogyo Co., Osaka Fuji Kogyo Co.

Derwent WPI, Dialog (R) File 351, "Film–forming process for titanium oxide film—includes sputtering process using target of titanium oxide (s) and sputtering gas contg. Ater vapor of certain partial pressure , etc.", WPI accession No. 1996–307067/199631, & JP 8134638 A, Abstract, May 28, 1996.

Derwent WPI, Dialog (R) File 351, "Sputtering appt . .— with backing plate coated with same material as film material to prevent reaction", JP 4276066 A, Oct. 1, 1992, WPI accession No. 1992–376727/199246, Abstract.

Derwent WPI, Dialog (R) File 351, "Ceramics rotary cathode target mfr.—is by roughening surface of cylindrical target holder, forming intermediate metal (alloy) layer, and plasma–spraying", WPI accession No. 1993–300013/199338, JP 5214525 A, Aug. 24, 1993.

Patent Abstracts of Japan, 06–330297, Nov. 29, 1994, Vacuum Metallurgical Co. Ltd., "Sputtering Target for Forming Dielectric Body Thin Film," Abstract.

Derwent accession No. 1996–339676, "Target for deposition appt..–comprises titanium oxide on undercoat of specific thermal expansion coefft.", Asahi Glass Co., Ltd (ASAG), JP 08158048A, Abstract.

Clipped Image JP409249967A, "High Purity Barium–Strontium Titanate Sputtering Target Material and Its Production", Sep. 22, 1997, Kazuo Watanabe, Hitoshi Maruyama, Terushi Mishima, Abstract.

(List continued on next page.)

*Primary Examiner*—Deborah Jones
*Assistant Examiner*—Jennifer McNeil
(74) *Attorney, Agent, or Firm*—Bacon & Thomas

(57) ABSTRACT

A process for coating a substrate with titanium dioxide, which process comprises the D.C. plasma sputtering and/or mid-frequency sputtering from a sputtering target which comprises sub-stoichiometric titanium dioxide, $TiO_x$, where x is below 2.

4 Claims, No Drawings

OTHER PUBLICATIONS

JP Laid–Open Patent Application No. 62–161945, Jul. 17, 1987, "Method of manufacturing ceramic sputtering target", T. Sakurai, A. Honda.

U.S. patent application Ser. No. 09/024,071, Vanderstraeten, filed Feb. 17, 1997.

U.S. patent application Ser. No. 09/101,690, Vanderstraeten, filed Jan. 3, 1997.

U.S. patent application Ser. No. 09/899,581, Vanderstraeten.

U.S. patent application Ser. No. 09/024,240, Vanderstraeten, filed Feb. 17, 1998.

U.S. patent application Ser. No. 09/759,661, Vanderstraeten, filed Jan. 12, 2001.

U.S. patent application Ser. No. 10/032,901, Vanderstraeten.

U.S. patent application Ser. No. 09/044,681, Vanderstraeten, filed Mar. 6, 1998.

U.S. patent application Ser. No. 09/966,636, Vanderstraeten.

U.S. patent application Ser. No. 10/001,964, Vanderstraeten, filed Dec. 12, 2001.

* cited by examiner

PROCESS FOR COATING A SUBSTRATE WITH TITANIUM DIOXIDE this application is a continuation of application Ser. No. 09/101,690, filed Sep. 28, 1998, now abandoned, which is a 371 if international application number PCT/EP97/00021, filed Jan. 3, 1997.

The present invention relates to an improved process for coating a substrate surface with titanium dioxide.

Sputtered coatings of various oxides (e.g. silica) and nitrides (e.g. silicon nitride) are used to form optical coatings showing interesting properties on a number of substrates. Known applications include low emissivity films on window glasses, cold mirrors on reflectors, enhanced mirrors for photocopiers and anti-reflective coatings on picture glass or TV screens. These coatings are usually made of stacks of several different layers with different refractive indices, preferably of low and high refractive index, to produce optical filters. For anti-reflective coatings it is preferred to combine two materials showing the highest and the lowest possible refractive indices. Such materials are titania and silica. Another advantage of these materials is their durability. For low emissivity films on window glasses it is preferred to combine a silver layer with a high refractive index material to dereflect the silver which improves light transmission.

Titanium dioxide coatings have a high refractive index and can thus be used to provide coatings of a high refractive index or to provide the high refractive index coatings in optical stacks. The existing process for producing titanium dioxide coatings comprises using titanium metal as the sputtering target and using oxygen as a component of the plasma gas. The titanium is thus converted to titanium dioxide during the sputtering process. Although satisfactory coatings of titanium dioxide can be produced, the rate of deposition is very slow and much slower than coating with zinc oxide and/or tin oxide. The stability of the sputtering process and the arc rate are both very dependent upon the conductivity of the target, particularly at high power levels.

As a substitute for titanium dioxide it has been suggested to use alternative materials such as niobium oxide. Whilst it is possible to coat a substrate with niobium oxide using a niobium metal target at slightly higher speeds than the equivalent process using titanium, niobium is very expensive.

JP-A-62-161945 describes a method of manufacturing a ceramic sputtering target in which a ceramic material consisting mainly of $ZrO_2$, $TiO_2$, $SiO_2$, $Ta_2O_3$, $Al_2O_3$, $Fe_2O_3$ or a compound of these materials, is sprayed using a water plasma spray to produce a formed body which may be used as a sputtering target. The sputtering target is used for high frequency sputtering of non-conductive target material.

JP-A-1-118807 describes a method for manufacturing titanium oxide thin films in which a target comprising titanium, titanium monoxide (TiO), or titanium dioxide ($TiO_2$) is used as a sputtering target and the target sputtered in a mixture of argon and oxygen using high frequency power density for example of 500 W.

There is, however, still a need for an improved process for coating titanium dioxide onto substrate materials. We have now surprisingly discovered that titanium dioxide can be sputtered from a target comprising sub-stoichiometric titanium dioxide of low resistivity of less than 1 ohm.cm, preferably less than 0.1 ohm.cm to provide coatings on a substrate either of sub-stoichiometric titanium dioxide, or titanium dioxide, depending upon the sputtering conditions.

Accordingly, the present invention provides a process for coating a substrate surface with titanium dioxide, which process comprises the D.C. plasma sputtering and/or midfrequency sputtering from a sputtering target which comprises sub-stoichiometric titanium dioxide, $TiO_x$, where x is below 2, and which has a resistivity of below 1 ohm.cm.

Sub-stoichiometric titanium dioxide, $TiO_x$, where x is below 2 and generally is in the range of from 1.55 to 1.95 is known in the art. It is a form of titanium dioxide which is conductive. Preferably the sub-stoichiometric titanium dioxide used in the present invention has a resistivity of below 0.1 ohm.cm.

The sputtering target which is used in the process of the present invention comprises sub-stoichiometric titanium dioxide, TiO coated onto a target base, such as a backing tube or plate, for example a target base of an electrically conductive material, for example stainless steel or titanium metal, aluminium or copper. Because the sub-stoichiometric titanium dioxide is conductive, D.C. plasma sputtering and/or mid-frequency sputtering, such as the Twin-Mag System may be used. D.C. plasma sputtering is, however, preferred. The target may be of any type known in the art, for example a rotatable target or a flat magnetron target.

The sputtering target used in the process of the present invention may be prepared by plasma spraying titanium dioxide, optionally together with niobium oxide, onto a target base in an atmosphere which is oxygen deficient and which does not contain oxygen-containing compounds, the target base being coated with $TiO_x$, where x is below 2, which is solidified under conditions which prevent the sub-stoichiometric titanium oxide from combining with oxygen. During the plasma spraying process, the action of the plasma on the titanium dioxide causes the titanium dioxide to lose some oxygen atoms from its lattice preferably from the surface of the particles. The titanium dioxide is converted into the sub-stoichiometric form, i.e. non-stoichiometric oxygen deficient titania The sputtering from the sub-stoichiometric titanium dioxide, $TiO_x$ target is preferably carried out using as the plasma gas argon, a mixture of argon and oxygen, a mixture of nitrogen and argon, or a mixture of nitrogen and oxygen. If the plasma gas does not contain oxygen, e.g. if pure argon is used, then the coating will comprise sub-stoichiometric titanium dioxide. The coating obtained is not completely transparent and possesses some conductivity. If, however, the plasma gas contains oxygen then the sub-stoichiometric form of titanium dioxide is converted during the sputtering process into the transparent form which is stoichiometric or substantially stoichiometric and has a high refractive index. The degree of transparency will depend upon the amount of oxygen contained in the plasma gas. A preferred gas mixture to form transparent titanium dioxide as the coating comprises 70–90% by volume argon and 30–10% by volume of oxygen.

The substrate which is coated according to this process may comprise, for example, optical glass, the screen of a cathode ray tube, such as a TV screen, cold mirrors, low-emissivity glasses, architectural glasses, anti-reflective panels, or flexible films such as oxygen barrier films.

The use of the target of the present invention avoids any avalanche effect of titania towards the metallic state or poisoned oxygen state. There is no need for a sophisticated gas control system or plasma monitoring equipment. The target can be easily operated and controlled to produce stoichiometric or non-stoichiometric films of any level of sub-stoichiometry. By operating the target in a slightly oxygen deficient sputtering process, a high refractive index film can be obtained which is important for optical coatings. Depending on the sputtering parameters, amorphous or crystalline films can be formed with a rutile or anatase structure. Rutile films have improved optical, mechanical and electrical properties. When the sub-stoichiometric titanium dioxide is sputtered under conditions such that the coating is formed comprises stoichiometric titanium dioxide, the coating is essentially transparent and colourless.

Although films coated with stoichiometric titanium dioxide, for example for use in the packaging industry, have good oxygen barrier properties, they are statically loaded which is particularly disadvantageous especially for the packaging of powdered products, such as coffee.

When the coating formed from the sub-stoichiometric titanium dioxide sputtering targets is also sub-stoichiometric titanium dioxide, it has a reduced transparency and slightly blue colour but is conductive and thus possesses anti-static properties having an electrical resistivity of above $3 \times 10^5$ ohm.cm. Accordingly, films coated with nonstoichiometric titanium dioxide not only have good oxygen barrier properties, but also possess particularly good anti-static properties which makes them particularly suitable for packaging applications, particularly in the food industry. A further advantage of films coated with sub-stoichiometric titanium dioxide is that the coatings possess good flexibility which even after excessive bending and creasing retain their oxygen barrier properties. Although the films have a slight blue colour this does not detract from the potential use of the product in the food industry, the blue colour providing a "fresh" look to the product. As barrier films for water vapour and oxygen, there is an improvement when compared with the prior art titanium dioxide coated films of five fold for water vapour and three fold for oxygen.

The main advantage of the present invention is that from the sub-stoichiometric titanium dioxide targets used in the present invention the rate of sputtering is increased by a factor of about ten as compared to sputtering from a titanium metal target, thus making the process industrially attractive. Furthermore, the sputtering process is very stable with little or no arcing occurring.

The present invention will be further described with reference to the following Examples.

Example 1 (Comparative)

A rotatable target comprising a tube of titanium metal of diameter 133 mm and length 800 mm was used to sputter titanium metal onto a glass plate placed at a distance of 18 cm from the target. The sputtering was carried out at a power level of 35 kW (80 A, 446V) under a pressure of $5 \times 10^{-3}$ mBar of argon as the plasma gas.

After 3½ minutes a layer of titanium metal 18000 Angstroms in thickness as measured by a profilometer had been deposited upon the glass plate.

Example 2 (Comparative)

The procedure of Example 1 was repeated but substituting a mixture of 80% $O_2$ and 20% Ar as the primary plasma gas to replace the argon primary plasma gas of Example 1. The sputtering was carried out at a power level of 45 kW (97 A, 460V) under a pressure of $4.5 \times 10^{-3}$ mBar. Using a titanium metal target as described in Example 1 a titanium dioxide layer of thickness 1500 Angstroms was deposited on a glass plate place above the target in 3½ minutes.

Example 3

A rotatable target comprising a tube of stainless steel of diameter 133 mm and length 800 mm was coated with sub-stoichiometric titanium dioxide, $TiO_x$, where x is below 2 as hereinbefore described by plasma spraying titanium dioxide onto the target using argon as the primary plasma gas and hydrogen as the secondary plasma gas. 72 liters (60% argon, 40% hydrogen) were used. The power level was 45 kW (455 A, 96V).

This target was then used as a sputtering target in the manner as described in Example 1. Using argon as the primary plasma gas the sputtering was carried out at a power level of 45 kW (97 A, 460V) under a pressure of $5.4 \times 10^{-3}$ Bar Ar. A dark blue semi-transparent layer of sub-stoichiometric titanium dioxide, $TiO_x$, of thickness 14000 Angstroms was deposited on a glass plate placed above the target in 3½ minutes. The sputtering proceeded smoothly without significant arcing.

Example 4

A rotatable target prepared as described in Example 3 was used as a sputtering target in the manner as described in Example 3 using a mixture of 75% Ar and 25% $O_2$ as the plasma gas. The sputtering was carried out at a power of 45 kW (95 A, 473V) under a pressure of $5 \times 10^{-3}$ mBar. A clear transparent coating of stoichiometric titanium dioxide of thickness 12500 Angstroms was deposited on a glass plate placed above the target in 3½ minutes. The sputtering proceeded smoothly without significant arcing.

Example 5 (Comparative)

A rotatable target was prepared as described in Example 3 by using pure argon (40 liters) at a power level of 34 kW (820 A, 42V). The electrical conductivity of the target was ten times inferior to that of Example 3. Sputtering from the target was difficult due to arcing. The process was not stable enough to produce samples.

What is claimed is:

1. A process for coating a substrate surface with titanium dioxide, which process comprises the D.C. plasma sputtering or mid-frequency sputtering from a rotatable sputtering target which consists essentially of sub-stoichiometric titanium dioxide, $TiO_x$, where x is below 2 and which has a resistivity of below 0.1 ohm.cm., the sputtering from the target being carried out using as the plasma gas argon, or a mixture of argon and nitrogen, whereby the coating formed on the substrate surface consists essentially of sub-stoichiometric titanium dioxide, $TiO_x$, where x is below 2.

2. A process as claimed in claim 1 wherein the substrate which is coated is optical glass, the screen of a cathode ray tube, a cold mirror, a low emissivity glass, an architectural glass, an anti-reflective panel glass, the screen of a cathode ray tube, a flexible film or a water vapor and oxygen barrier film.

3. A process as claimed in claim 1 wherein the rotatable target has a cylindrical shape.

4. A process as claimed in claim 3 wherein the sputtering target was prepared with a power level of 45 kW.

* * * * *